(12) United States Patent
Osada et al.

(10) Patent No.: US 6,271,585 B1
(45) Date of Patent: Aug. 7, 2001

(54) HEAT SINK SUBSTRATE CONSISTING ESSENTIALLY OF COPPER AND MOLYBDENUM AND METHOD OF MANUFACTURING THE SAME

(75) Inventors: Mitsuo Osada, Yamagata; Akira Ichida, Toyama; Norio Hirayama, Yamagata; Kiyoshi Asai, Yamagata; Hidetoshi Maesato, Yamagata; Tadashi Arikawa, Toyama, all of (JP)

(73) Assignee: Tokyo Tungsten Co., Ltd., Tokyo (JP)

(*) Notice: Subject to any disclaimer, the term of this patent is extended or adjusted under 35 U.S.C. 154(b) by 0 days.

(21) Appl. No.: 09/110,669

(22) Filed: Jul. 7, 1998

(30) Foreign Application Priority Data

| Jul. 8, 1997 | (JP) | 9-182043 |
| Aug. 22, 1997 | (JP) | 9-226361 |
| Feb. 17, 1998 | (JP) | 10-034430 |

(51) Int. Cl.$^7$ .................................................. H01L 23/34
(52) U.S. Cl. .............................. 257/712; 257/796; 75/247
(58) Field of Search .................................... 257/712, 796; 75/246, 247

(56) References Cited

U.S. PATENT DOCUMENTS 5,493,153 * 2/1996 Arikawa et al. ................. 257/796
5,886,269 * 3/1999 Kai et al. ........................... 75/245

* cited by examiner

Primary Examiner—Sara Crane
(74) Attorney, Agent, or Firm—Sughrue, Mion, Zinn, Macpeak & Seas, PLLC

(57) ABSTRACT

A heat sink substrate comprises a Cu—Mo composite substrate composed of a molybdenum (Mo) green compact with which Copper (Cu) of 20-60 wt % is impregnated. It is preferable that the heat sink substrate is a rolled plate obtained by repeatedly warm rolling or cold rolling the Cu—Mo composite substrate and that the rolled plate does not include any fine void and unevenly impregnated copper, that is, copper and molybdenum are uniformly distributed therein.

27 Claims, 7 Drawing Sheets

RELATIONSHIP BETWEEN Mo PARTICLE SIZE
AND COMPACTING PRESSURE

COMPARISON OF MANUFACTURING PROCESS

EFFECT OF ANNEALING TEMPERATURE ON MECHANICAL PROPERTIES OF VARIOUS PURE COPPER SHEETS (1mm AT 50% ROLLING)

RELATIONSHIP BETWEEN TEMPERATURE
AND THERMAL CONDUCTIVITY

HEAT SINK SUBSTRATE CONSISTING ESSENTIALLY OF COPPER AND MOLYBDENUM AND METHOD OF MANUFACTURING THE SAME

BACKGROUND OF THE INVENTION (1) Field of the Invention

The present invention relates to a heat sink substrate having a large area and a method of manufacturing the same and, more specifically, to a large area heat sink substrate which is mounted on a power semiconductor such as a metal oxide semiconductor field effect transistor (MOSFET), IGBT and the like and on a large capacity rectifier used to an electric railcar, electric automobile and so on and a method of manufacturing the heat sink substrate.

(2) Description of the Related Art

Semiconductors have been widely used and, in particular, so-called power semiconductors including MOSFETs, IGBTs and so on which generate heat have been extensively used in various fields expanding from industrial equipment to household equipment. As the power semiconductors are applied to electric cars and automobiles including hybrid vehicles, their output power and size are outstandingly increased and the amount of heat generated by them is inevitably increased.

Power semiconductors, from which a current of several hundreds of amperes flows, are different from MPUs (microprocessor units) conventionally used in so-called personal computers and so on in the materials constituting them and the design of their structure and they may substantially generate an amount of heat of several kilowatts. Their size is, for example, about 98–375 cm$^2$ which is at least ten times the size of the MPUs which is about 2.2–25 cm$^2$. Thus, the power semiconductors are often used under severe conditions as to vibration, humidity, temperature, strength and so on. As a result, when they are repeatedly used many times under the very severe conditions, cracking, exfoliation and the like are caused to them and their life is ended regardless of that no cracking and exfoliation are seemingly caused thereto.

Further, the power semiconductor is required for reliability which is more severe than that required to the MPU. In particular, the power semiconductor must pass a life test of several hundreds to several thousands of times in terms of a heat cycle as a parameter, as to deformation caused by the warp and the like of a substrate mounted on it and the occurrence of cracking, in spite of that the power semiconductor has a large area. Accordingly, when a heat sink substrate having a large area of, for example, about 100–400 cm$^2$ is warped or when a heat sink substrate, on which a plurality of semiconductor elements are mounted, generates heat and the semiconductor elements are differently expanded by the heat, cracking and exfoliation are caused to the heat sink substrate due to the warp of the heat sink substrate or the different thermal expansion of the components and straining resulting from the expansion, even if the heat sink substrate has passed a life test executed in the state that it outputs a considerably large power (10–50 W) in a severe environment. From the above-mentioned, difference in size of the heat sink substrate is an important technical problem.

It is preferable for the heat sink substrate of the power semiconductor to have thermal conductivity of at least 200 W/m·K and more preferably at least 230 W/m·K. In addition, the heat sink substrate must have suitably small thermal expansion and strength which is larger than that of a copper material. Further, more important is that the thermal conductivity of the material of the heat sink substrate is not lowered, even if heat is generated thereto, to such a degree as to injure the operation thereof when the heat sink substrate is practically used.

On the other hand, there is generally a problem that an increase in the size of a metal heat sink material makes the characteristic anisotropy thereof more outstanding. The inventors have studied and developed a single-layer composite material by mixing a copper powder with a molybdenum powder and sintering and rolling them. The single-layer composite material is considerably uniform as an entire body and has a small amount of characteristic anisotropy. The single-layer composite material has not any void as well as the thermal conductivity and thermal expansion coefficient thereof are very closely analogous to the values which are prescribed from a mixing ratio of copper and molybdenum, even if the composite material does not contain a sintering assistant agent. Thus, it is supposed that the single-layer composite material can be effectively used to a heat sink substrate for a device on which semiconductor elements are mounted.

However, when a usual plate is rolled in an ordinary process, it is economically difficult to make the characteristic anisotropy thereof to zero. When the composite material is, for example, cross rolled, the size thereof is regulated by the work rolls used in the rolling as well as it is difficult to finish the composite material without leaving straining which take places in the rolling in the interior of the composite material. Accordingly, the single-layer composite material has been not suitable as a material as a heat sink substrate which constitutes a power semiconductor having a large area and high reliability. That is, even if the joint shape of the composite material and a joint agent used to it are changed, there cannot be obtained a heat sink substrate for the power semiconductor device.

It is possible to prepare a plate member having a length of at least 200 mm in one direction and an amount of warping of 200 μm. However, this plate member is inconvenient because the warping thereof is increased by residual straining while it is annealed or subjected to surface processing such as plating and the like. That is, it is required that a heat sink substrate which will be assembled to a large area power semiconductor has substantially no residual straining or a minimal possible amount of residual straining.

Further, a material that satisfies the following performances is required to a heat sink substrate used to the power semiconductor.

First, the material has thermal conductivity of at least 200 W/m·K (at a room temperature-200° C.), preferably at least 230 W/m·K, and most preferably at least 300 W/m·K as a temperature increases. In this state, however, the thermal expansion coefficient of copper (=370 W/m·K), for example, is 16–17×10$^{-6}$/K and the Young's modulus thereof is also low (13×10$^3$ kgf/mm$^2$). In practical use, it is impossible to devise an arrangement having reliability from the material, since the heat sink substrate made of the material is cracked and exfoliated as well as the thermal expansion coefficient and Young's modulus thereof are excessively different from the elements mounted thereon and the peripheral material thereof.

To cope with the above problem, a semiconductor element is mounted on a material which is mainly composed of multilayer material, such as Cu/Al$_2$O$_3$/Cu, Cu/AlN/Cu, Cu/AlN, AlN, Al$_2$O$_3$ and so on. It is essential that the heat sink substrate uses the material which has a thermal conductivity superior to that of AlN having the maximum thermal conductivity of 200 W/m·K among the materials which at least regulate a heat sink property and can be practically put into market. An Al/SiC composite material is said to be light in weight and to have high thermal conductivity and is such that when it is heated to about 120–150° C., the thermal conductivity thereof is lowered by about 20%. Further, although some materials, which are put into market in the state that they are subjected to a melting and impregnating process, have thermal conductivity of 200 W/m·K at an ordinary temperature, they are not sufficiently satisfied in practical application because their thermal conductivity is lowered to 160 W/m·K at 120° C.

The thermal expansion coefficient is $12 \times 10^{-6}$/K or less and preferably $9 \times 10^{-6}$/K or less. It can be said that a material which is most affected by other material in the restricting relationship with it, warping and the like is ceramic. When only this point is taken into consideration, the thermal expansion coefficient is most preferably $7–8 \times 10^{-6}$/K. However, when the thermal expansion coefficient is $9 \times 10^{-6}$/K or less, it is sufficient to take some conventional arranging methods of easing stress into consideration. Moreover, when the aforesaid semiconductor elements are mounted on a copper laminated ceramic substrate, a thermal expansion coefficient of $12 \times 10^{-6}$/K or less is acceptable.

As to Young's modulus, since the heat sink substrate is arranged as a portion of the so-called structural member of the power semiconductor device, it is important that the heat sink substrate can protect the device. The heat sink substrate of conventional power semiconductor devices can be composed of copper. Since the power semiconductor device outputs a large power, the temperature of the device increases up to about 100–150° C. Thus, it is preferable that a material containing at least copper has strength which is larger than that of copper. It is found as the characteristics of pure copper that when its temperature exceeds 150° C., the tensile strength thereof is outstandingly lowered. Since Young's modulus has a behavior similar to tensile strength, it is preferable that Young's modulus is at least about $15–16 \times 10^3$ kgf/mm².

Although it is apparent that copper cannot be employed as the material of the heat sink substrate as described above, there is an Al/SiC composite material as a commercially available heat sink material to which attention is paid recently. Since the Al/SiC composite material is light in weight and less expensive, it is examined also as a heat sink substrate for a hybrid automobile. This material has thermal conductivity of 200 W/m·K at an ordinary temperature. since the thermal conductivity lowers to about 160 W/m·K at 150° C., however, the material has an essential weak point.

Recently, cooling of a large capacity rectifier is used to an electric railcar and electric automobile and becomes an important problem. Therefore, a requirement is demanded for a relatively large heat sink member on which the rectifier and relating components are mounted and which is connected to a cooler. A metal material, such as aluminum, copper, etc., is contemplated to be suitable as a material for the heat sink member from a view point of thermal conduction. These materials have a large amount of thermal expansion. However, when they are connected to a silicon unit as a main component of the rectifier and to an insulating material such as an aluminum nitride substrate or the like to which the silicon unit is assembled, there is a possibility that the materials are deformed or broken by the thermal strain resulting from the difference of thermal expansion which arises when the materials are soldered and connected to the substrate or repeatedly used. Accordingly, a material is required which has thermal expansion closely analogous to that of a semiconductor and ceramic insulating material and is excellent in thermal conduction.

When the heat sink substrate is applied to the rectifier, the heat sink substrate requires for the physical properties similar to those have been conventionally required to the heat sink substrate of a ceramic package on which semiconductor elements are mounted.

In particular, when a heat sink substrate is connected to alumina ceramic, such as a pin grid array and the like, by silver soldering, it is connected thereto at a high connecting temperature of 890–900° C. In this case, the heat sink substrate is assembled under more severe temperature condition to prevent the ceramic material from being deformed or broken by thermal the strain which is caused when the heat sink substrate is cooled. Therefore, in the selection of a material to be used for the heat sink substrate, whether the material has a thermal expansion characteristic near to that of the ceramic material such as alumina, beryllia and the like is more important than whether the material has excellent thermal conduction or not. There has been proposed a composite material of tungsten (W) and copper (Cu) (hereinafter, referred to as a W-Cu composite material) and widely used as a material satisfying the above condition. A method of manufacturing the W-Cu composite material is such that an organic binder is added to and mixed with a tungsten powder, the mixture is compacted in a metal mold, heated in a reducing atmosphere such as hydrogen etc. and a powder aggregate is obtained by evaporating, decomposing and removing the organic binder. Subsequently, a porous tungsten material having prescribed porosity is obtained by sintering the powder aggregate in a reducing atmosphere and then the W—Cu composite material is obtained by infiltrating the powder aggregate with copper in a reducing atmosphere having a temperature higher than the melting point of copper.

A heat sink substrate for an IC (integrated circuit) package which uses ceramic as its constituting material must have thermal expansion near to that of alumina and beryllia to avoid the aforesaid problem of thermal strain. Thus, use is made of a W—Cu composite material infiltrated with copper in an amount of 10–15 wt %.

In the economical manufacture of the porous tungsten material infiltrated with copper in the above weight percent, a tungsten powder is added with a slight amount nickel or the like and is often used so that the porous tungsten material can be obtained at a relatively low temperature of 1200–1350° C. and that the infiltration of copper can be easily executed, although thermal conduction is made lower than the most preferable value at the time.

Incidentally, in a heat sink substrate which has components relating to a large capacity rectifier mounted thereon and is connected to a cooling apparatus, such as a radiator or the like, since the heat sink substrate is connected to the rectifier (silicon unit) and to an aluminum nitride substrate on which the silicon unit is assembled by means of a low melting point material such as solder, the allowable range of the thermal expansion of the heat sink substrate is increased as compared with the case of the aforesaid ceramic semiconductor package.

Since the large capacity rectifier generates during operation, heat greatly larger than that generated by a semiconductor element. Therefore, it is an important factor in the selection of the heat sink material whether or not a material has excellent heat conduction. A large and light material is required in addition to the above factor.

Accordingly, the W—Cu composite material is used for the package on which the semiconductor element is mounted. Moreover, the W—Cu composite material is not always suitably used for the large capacity rectifier in both the characteristics and manufacturing method thereof. Further, a method of manufacturing the Cu—Mo composite material must extract physical properties which are intrinsically provided with the material as well as must be an industrially applicable method.

On the other hand, it is self-evident that a product finished by a compacting process does not have a sufficiently satisfactory outside surface condition when it is left in a honed state. The surface condition of the product in the previous Art can be enhanced and the product can be easily made by subjecting it to a rolling process in a minimum necessary range. The rolling process will be very effective if the compacting process can be intrinsically easily carried out thereby.

It is expected that the application of the present invention to a heat sink substrate with a not large but ordinary size used to a microwave package, which has been difficult to be made by the above method, can solve a problem for improving the applicability of the material.

The aforesaid heat sink has been made of a Cu—W material which is obtained by infiltrating porous tungsten with melted copper. The Cu—W material ordinarily contains copper in an amount of 10–20 wt % and has excellent characteristics that a thermal expansion coefficient is 6–7× $10^{-6}$/K and a thermal conductivity is 210–250 W/m·K. However, the Cu—W material has a defect that the density and weight thereof are large and which increasingly becomes an important factor to be solved as the reduction of weight and size of a part composed of it is expedited. Further, since the material is worked by being cut, it is also a problem that the thickness thereof cannot be reduced, herein a limit of thickness is 0.5 mm, and the area thereof cannot be increased, herein larger than a size corresponding to a B5 size.

Although there is commercially available a 15–20 wt % Cu—Mo material composed of porous molybdenum infiltrated with melted copper, the material has a problem in a thickness and an increase of an area likewise the Cu—W material and it cannot be said that the cost thereof is cheap.

Since a large substrate is used to a power semiconductor employed by an electric automobile and an electric rail car and generates heat in an amount larger than that generated by an ordinary semiconductor package, important characteristics required to it is a heat sink property, matching of the thermal expansion of it to other substrates and warping.

As to the size of the heat sink substrate, a substrate having a thickness of 2–4 mm and an area of 98–375 cm$^2$ is called a large substrate. The area of the large substrate is at least ten times that of a substrate for MPU having an area of 2.2–25 cm$^2$.

The materials called TT-RCM, registered trademark No. 2626137, are sintered body which are formed from compacted body of Cu and Mo powders and, typically, have been put into market contain copper in an amount of at least 40 wt % which material is called "RCM" as a product name of Tokyo Tungsten CO. LTD. The sintered body has a limited thickness to be rolled from the material, and which thickness depends upon the amount of copper contained in the sintered body. In particular, it is difficult to make a large substrate which is suitable for a power semiconductor in a region of the copper content of 40 wt % or less.

On the other hand, the molybdenum material impregnated with copper is referred to as "PCM". Although, the material named as "PCM20" comprises molybdenum impregnated with copper of 20 wt % and has somewhat low thermal conductivity of 170 W/m·K, it is a value which is practically applicable as a heat sink property. The thermal expansion coefficient of PCM20 is 7×$10^{-6}$/K which is nearer to that of silicon. As a result, PCM20 has an advantage that the matching property thereof with a substrate is improved and the quality thereof is improved because cracking, fracture and the like is not caused and degree of occurrence of warping is reduced due to increased rigidity. Whether emphasis is put on a thermal expansion coefficient or thermal conductivity depends on the application of the material, by which the number of choices can be increased.

On the other hand, although 40–60 wt % Cu—Mo materials referred to as "TT-RCMs 40–60", in particular, RCM 60 has a large thermal expansion coefficient of 12.3×$10^{-6}$/K, it has high thermal conductivity of 286 W/m·K. Therefore, it is widely used as a heat sink substrate for gallium arsenic, GaAs. However, since RCMs are a so-called dispersing-reinforced-type composite material in which copper particles and molybdenum particles are very finely and uniformly mixed, they have a defect that a working property is a little inferior to that of PCMs and a manufacturing cost is expensive.

SUMMARY OF THE INVENTION

It is therefore an object of the present invention to provide a large area heat sink substrate which has various performances for mounting a power semiconductor element thereon as well as can form a power semiconductor device having a large area and a pinpoint accuracy.

It is another object of the present invention to provide a method of manufacturing the heat sink substrate.

It is still another object of the present invention to provide a power semiconductor device using the large area heat sink substrate.

It is yet another object of the present invention to provide a heat sink substrate having a large area so that it is mounted on a large capacity rectifier used to an electric rail car, an electric automobile and so on.

It is a further object of the present invention to provide a method of manufacturing the heat sink substrate.

It is a still further object of the present invention to provide a large area heat sink substrate which can be easily manufactured, has a thermal expansion coefficient near to that of a semiconductor and ceramic insulator and is excellent in a thermal conductive property.

It is a yet further object of the present invention to provide a method of manufacturing the heat sink substrate.

It is another object of the present invention to provide a large area heat sink substrate in which a cost resulting from a lot of processes and the complexity of the processes can be lowered, the shape of which is not seemingly different from that of a conventional heat sink substrate and which is economically advantageous.

It is still another object of the present invention to provide a method of manufacturing the heat sink substrate.

According to an aspect of the present invention, there is obtained a heat sink substrate which comprises a Cu-Mo composite substrate composed of a molybdenum (Mo) green compact into which melted copper (Cu) is impregnated in an amount of 20–60 wt %.

In the heat sink substrate in the above aspect of the present invention, it is preferable that the heat sink substrate is a rolled plate obtained by being repeatedly subjected to cold rolling or warm rolling at 400° C. or less and does not include any fine void and unevenly impregnated copper (copper and molybdenum are uniformly distributed).

According to another aspect of the present invention, there is selected a Cu-Mo composite substrate which is made by impregnating a green compact with a copper powder of 40–60 wt %, the green compact being made of a mixed powder that is composed of a molybdenum powder with which a copper powder of 5 wt % or less is previously mixed.

According to still another aspect of the present invention, there is provided a large area heat sink substrate used to a power semiconductor device and having a plurality of semiconductor elements mounted thereon, the heat sink substrate comprising a single layer composite material composed of copper and molybdenum, wherein the heat sink substrate has thermal conductivity of at least 200 W/m·K and a thermal expansion coefficient of $12 \times 10^{-6}$/K or less within the temperature range of from an ordinary (room) temperature to 200° C. and can constitute the power semiconductor device having high reliability by being made in a process in which the warp of the heat sink substrate is suppressed to 100 µm or less and a less amount of residual strain is caused.

According to yet another aspect of the present invention, there is obtained a method of manufacturing a Cu-Mo composite heat sink substrate, the method comprising the steps of forming a green compact by compacting a molybdenum powder having an average particle size (FSSS) of 2–6 µm by a hydraulic press or a cold isostatic press (CIP) under pressure 5 ton/cm$^2$; and impregnating the molybdenum green compact with copper of 20–60 wt % in a reducing or inert gas atmosphere furnace at 1083–1300° C. to thereby obtain a Cu—Mo composite substrate.

According to a further aspect of the present invention, there is obtained a method of manufacturing a Cu—Mo heat sink substrate, the method comprising the steps of mixing a molybdenum powder having an average particle size (FSSS) of 2–6 µm with a copper powder of 5% or less; forming a green compact by compacting a resultant mixed powder by a hydraulic press or a cold isostatic press (CIP) under pressure 5 ton/cm$^2$; and impregnating the green compact with copper of 40–60 wt % in a reducing or inert gas atmosphere furnace at 1083–1300° C. to thereby obtain a Cu-Mo composite substrate According to a still further aspect of the present invention, there is obtained a method of manufacturing a heat sink substrate which comprises the steps of sufficiently mixing a copper powder with a molybdenum powder; forming a green compact by compacting a resulting mixture by a cold isostatic press (CIP) within a thickness range of 3–14 mm; sintering the green compact at a prescribed sintering temperature and quenching the same; and rolling a sintered green compact while suppressing a degree of rolling to 25–40% to thereby obtain a large area heat sink substrate whose characteristic anisotropy is suppressed in a substrate surface direction.

DESCRIPTION OF THE PREFERRED EMBODIMENT

Figure 1:
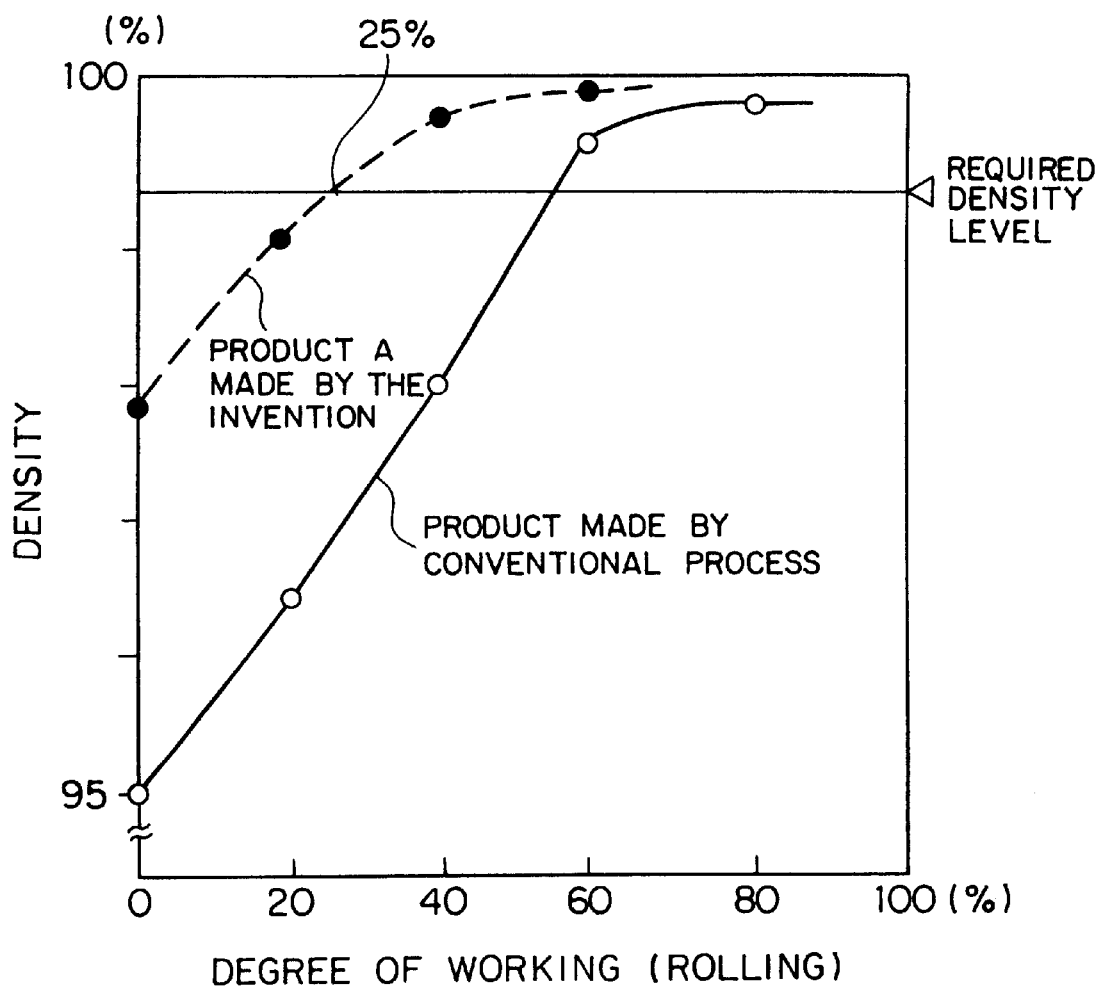
FIG. 1 is a graph showing the relationship between the rate of working and density of a large area heat sink substrate according to an example of the present invention and that according to prior art.

First, a process of the invention will be described in which a large area heat sink substrate according to the present invention.

Table 1 shows a list (a catalogue of the company) of the characteristics of various types of heat sink materials. In the list, the product name RCM of plate materials indicates the aforesaid copper-molybdenum single layer composite material. As described above, the inventors have studied and developed the copper-molybdenum single layer composite material and which is put into practical use.

TABLE 1

Characteristics of Various Heat Sink Board Materials

| Material | Characteristics | | Density (Mg/m$^3$) | Thermal Conductivity (W/m · K) | Thermal Expansion Coefficient ($\times 10^{-6}$/K) | Resistivity (Ω · cm) | Conductivity (1 ACS %) | Young's Modulus ($\times 10^3$ kgf/mm$^2$) | Hardness (Hv) | Tensile Strength (kgf/mm$^2$) |
|---|---|---|---|---|---|---|---|---|---|---|
| Sheet Material | CMC | 111 | 9.4 | 260 | 9.2 | — | — | — | — | 47 |
| | | 212 | 9.2 | 310 | 14.8 | — | — | — | — | 26 |
| | RCM | 40 | 9.6 | 234 | 8.7 | $3.4 \times 10^{-6}$ | 50 | 20.8 | 200 | 62 |
| | | 50 | 9.5 | 260 | 10.5 | $3.0 \times 10^{-6}$ | 57 | 19.0 | 180 | 55 |
| | | 60 | 9.4 | 286 | 12.3 | $2.7 \times 10^{-6}$ | 64 | 17.1 | 160 | 47 |
| | | 70 | 9.3 | 312 | 14.1 | $2.4 \times 10^{-6}$ | 71 | 15.2 | 140 | 43 |
| | | 80 | 9.2 | 338 | 15.9 | $2.2 \times 10^{-6}$ | 78 | 13.3 | 120 | — |
| | CIC | 111 | 8.6 | 31 | 10.5 | — | — | — | — | — |
| | Mo | | 10.19 | 142 | 5.1 | $5.78 \times 10^{-6}$ | 29.8 | 28.2 | 270 | 85 |
| | W | | 19.21 | 167 | 4.4 | $5.5 \times 10^{-6}$ | 31.3 | 35.2 | 420 | 120 |
| Semi- | Si | | 2.3 | 140 | 4.2 | $2.3 \times 10^{-5}$ | | 19 | — | — |

TABLE 1-continued

Characteristics of Various Heat Sink Board Materials

| Material | Characteristics | Density (Mg/m³) | Thermal Conductivity (W/m · K) | Thermal Expansion Coefficient (× 10⁻⁶/K) | Resistivity (Ω · cm) | Conductivity (1 ACS %) | Young's Modulus (× 10³ kgf/mm²) | Hardness (Hv) | Tensile Strength (kgf/mm²) |
|---|---|---|---|---|---|---|---|---|---|
| conductor | GaAs | 5.3 | 54 | 6.5 | 3.8 × 10⁻⁶ | | — | — | — |
| Metal | Al | 2.7 | 238 | 23.5 | — | | 7.4 | — | — |
| | Ag | 10.4 | 419 | 19.1 | — | | 9.8 | — | — |
| | Cu | 8.9 | 394 | 17.0 | 1.7241 × 10⁻⁵ | 100 | 13.3 | 68 | 24 |
| | Fe | 7.9 | 68 | 12.1 | — | | 18.6 | — | — |
| | Ni | 8.9 | 83 | 13.3 | — | | 20.1 | — | — |
| | Cu—W | 15.65– | 209–247 | 6.5–8.5 | 3.4–4.3 × 10⁻⁶ | | 29–34 | 260–300 | 50–57 |
| | Al—Si | 2.53 | 125 | 13.0 | 8.1 × 10⁻⁶ | | — | — | 35 |
| | Fe—N—Co | 8.3 | 17 | 5.3 | 4.9 × 10⁻⁵ | | 14 | 160 | — |
| Ceramic | Al₂O₃ | 3.6 | 17 | 6.7 | 10¹⁴ | | 32 | 1100 | 55 |
| | AlN | 4.5 | 170 | 4.4 | 10¹³ | | 34 | 1200 | — |
| | BeO | 2.7 | 230 | 7.6 | 10¹⁵ | | 38 | 1200 | — |
| | SiC | 3.2 | 42 | 4.7 | 10¹² | | 34 | 1400 | — |

Note)
RCM 40 Cu40 wt %, Mo 60 wt %
RCM 50 Cu50 wt %, Mo 50 wt %
RCM 60 Cu60 wt %, Mo 40 wt %

The materials named RCM40, RCM50 and RCM60 of TT-RCMs[R], registered trade mark, in Table 1 which are processed by a conventional rolling process can be used as a heat sink material from a view point of thermal conductivity and a thermal expansion coefficient and they have sufficient rigidity. It is found, however, that they have a large amount of characteristic anisotropy.

More specifically, when these materials are used to a large area heat sink substrate, characteristic anisotropy as shown in the conventional products of Table 2 is inevitably caused to them, which is a main reason why they lack reliability. Further, they also have a defect that when they are repeatedly rolled, a large amount of strain is caused thereto by that they are in line contact with a roll. The stain cannot be removed even if they are annealed and they are warped by the strain.

So long as desired characteristics can be obtained, it is possible to delete the rolling process or minimize the use of the rolling process so as to avoid the above defect. However, when the above process is applied to a large area plate material, the material cannot be rolled to a plate having a uniform thickness and cracked in rolling or copper is oscillated (unevenly distributed) in sintering, thus the quality of the material is varied in a subsequent process.

TABLE 2

Characteristics of copper-molybdenum single layer composite material

| | Invented product (A) | Conventional product |
|---|---|---|
| Thermal expansion coefficient | 8.9 × 10⁻⁶/K anisotropy 0.7 × 10⁻⁶/K | 8.7 × 10⁻⁶/K anisotropy 1–2 × 10⁻⁶/K |
| Thermal conductivity | 230 W/m.K anisotropy 18 W/m.K | 234 W/m.K anisotropy 20–40 W/m.K |
| Young's modulus | 205 GPa anisotropy_2 (can be regarded as zero) | 204 GPa — (not measured) |

TABLE 2-continued

Characteristics of copper-molybdenum single layer composite material

| | Invented product (A) | Conventional product |
|---|---|---|
| Finished thickness of producible plate | 1.4–10.0 (Example 1, T3.1) | 0.5–3.0 |

Incidentally, a material powder is ordinarily compacted by a metal mold press or charged into a rubber case having a desired shape and compacted by a cold isostatic press (hereinafter, abbreviated as CIP).

In the present invention, a material is compacted using the press. It is important in the present invention to provide a thin compacted body with a good shape. In the present invention, a prescribed mixed powder of copper and molybdenum is charged into a thin resin film bag in a space surrounded by side bars for setting a desired thickness, the powder in the film bag is arranged to a desired shape with a squeezing rod, iron plates are disposed on and under the powder in the bag so as to sandwich it, the bag is put into a rubber case as a whole and compacted by the cold isostatic press. It is found that when the compacted body has a thickness of 3–14 mm, it can be formed to a shape having a large area. This is because that when the thickness of the compacted body is less than 3 mm, a compacting pressure must be increased to at least 3 ton/cm² and in such a case, the bite of the film into the power is caused as well as it is difficult to operate the isostatic press within its standard specification, that is, with a compacting pressure of approximately 2 ton/cm² or less. Whereas, when the thickness exceeds 14 mm, there is a disadvantage that the oscillation of copper cannot be suppressed in sintering.

It is found in the present invention that when the CIP-worked body is sintered, the shape accuracy thereof is greatly improved as compared with that made by a conventional method and a good plate having a less amount of oscillation of copper can be obtained. In addition, since the thickness required to a heat sink substrate is 2–5 mm and the thickness of a heat sink substrate which can be made from a good CIP-worked body made by the aforesaid method is within a range of 1.4–10.0 mm, it can be said that a practically applicable method has been developed.

Moreover, as shown in FIG. 1, the density of the compacted body of the present invention is increased from about 95%, which is obtained in a compacted body made by the conventional method, to about 98%. Accordingly, it is found that when the material of the present invention is rolled in a degree of 25–45%, the density of the material can be increased to at least 99.3% at which air tightness of at least $1 \times 10^{-13}$ Torr, which is required to a heat sink, can be achieved when an air tightness test is carried out using a leak detector and further characteristic anisotropy can be greatly improved. In addition, plating can be stably applied to the material in this level of finish (the material is in a minute state without void).

There is available forging, in addition to the above method, as a method of working the compacted body by which the occurrence of strain and characteristic anisotropy can be suppressed. Since a large area plate is required, free forging is basically employed. When the forging is employed, however, the upper and lower surfaces of a forged material are varied, the material is polluted with a lubricating agent (applied to a metal mold), a forging operation is made troublesome when a degree of working is made higher than a necessary level and the material must be reheated. Thus, the cost of the forged material is inevitably increased.

As described above, the amount of copper to be contained in the RCM material may be set so that forging conditions are satisfied only to a single layer composite material in which 35–60 wt % of molybdenum is substantially contained and the inventors eagerly repeated a test. As a result, when the amount of copper was set within a range of 35–65 wt %, there could be obtained a forged material which had almost no polluted surface layer and was in good lubrication with a mold when it is forged under the conditions that a preheating temperature was set to 900–960° C., oxide (soot) deposited on the surface of the material was removed by air pressure each time the material is forged and a very weak lubricating agent diluted with water at a rate of 20–30 times was coated onto the surface of the material in a very thin thickness (Deltaforge #31, made by Nippon Achison).

The copper content of 35 wt % or less is not suitable because a heating temperature must be increased, the amount of soot is abruptly increased and a layer polluted by carbonization is created to the outside surface of the material.

Further, it is important that the degree of forging is set within the range in which sufficient characteristics can be provided with the material likewise the rolling process and excessive forging must be refrained. It is found that when a raw plate is forged in the degree of at least 50 % within a thickness of 4.5–20 mm, a large area heat sink substrate that has the same performance as above can be obtained. The forging method is more excellent than the rolling process in characteristic anisotropy but the method has a defect that the accuracy of a plate thickness is difficult to be maintained and a product to which a lapping process is inevitably required must be suitably subjected to a cutting process to regulate the thickness thereof. The forging process also has a defect that when a plate material, which is finished to a final thickness of 3 mm or less, is forged in the degree of at least 70%, the occurrence of cracking and the like to the outer periphery thereof is increased.

Next, the present invention will be described below in detail.

To obtain a composite material that contains copper in an amount of at least 30 wt % as disclosed in the present invention, a porous body having apparent density of 6.7 (g/cm$^3$) or less must be prepared as a molybdenum porous body with which copper is impregnated. However, it is difficult for a conventional method to prepare the above porous body.

According to the present invention, there has been obtained a method of manufacturing a Mo—Cu composite material by eagerly repeating a test. The method is arranged such that a green compact having prescribed porosity is made by an isostatic compacting method without adding an organic binder to a molybdenum powder and the Mo-Cu composite material is made by impregnating the green compact with copper. In the manufacturing method, methods of regulating the molybdenum powder and compacting the same are properly selected.

The molybdenum metal powder used as a material of the present invention is an industrially used molybdenum metal powder and can be obtained by reducing a molybdenum oxide material with hydrogen. In the present invention, it is a matter of course that the general matters to be attended in powder metallurgy are applied. The characteristics of the powder mainly depend upon such factors as a reducing temperature, hydrogen partial pressure, water partial pressure and the like. The characteristics of a green compact made from the powder are controlled by compacting pressure, the characteristics including how the voids of the green compact exist.

In the present invention, the particle size of the molybdenum powder material is within a range of 2–6 μm in terms of FSSS particle size. A reason why it is regulated to the range is to avoid the following disadvantage caused when the particle size is outside of the range. That is, since the characteristics of the green compact before and after it is heated is such that when the particle size of the molybdenum powder material is too fine, the volume thereof is increased, and when compacting pressure is increased to obtain desired apparent density, not only the molybdenum powder is liable to be aggregated after it is impregnated with copper but also a load on a press machine is increased. A critical minimum particle size is about 1.8 μm and no problem arises in the particle size of 2.0 μm which is larger than 1.8 μm.

Whereas, when the particle size of the molybdenum powder material is too coarse, a compacting property is lowered and the periphery of the green compact is liable to be collapsed when it is handled. A critical maximum particle size is about 6.5 μm.

In the present invention, a temperature at which the molybdenum powder is impregnated with copper is within a range of 1083 (preferably 1150)–1300° C. A reason of it is that it is found that a composite body up to 9 mm thick can be stably obtained at the temperature range without the occurrence of a void. In addition to it, the temperature range is an excellent condition under which each green compact mentioned above is difficult to be unnaturally deformed.

In the present invention, the pressure of the CIP is 5 ton/cm$^2$ or less. A reason of it is as described below. In the manufacture of a composite material by the impregnation of copper, when the composite material is subjected to so-called sintering in the process of impregnation, desired porosity is changed and the composite material cannot be impregnated with copper of 30 wt % or more. Therefore, it is an important condition that the structure of the green compact is very fine even after the impregnation. Further, it is also an important condition that the compacting pressure does not exceed 5 ton/cm², in addition to the above particle size and temperature.

When the degree of rolling of a heat sink substrate material is increased, the structure thereof resulting from the rolling process particularly appears in the form of a molybdenum crystal grain. When the degree of rolling is beyond a certain limit, a predictable feature of the material according to the present invention, for example, anisotropy will appear.

In the present invention, a heat sink substrate having an ordinary size can be manufactured without sacrificing desired characteristics when rolling is carried out within a range of 40%. It is found, however, that when the rolling is preferably carried out within the degree of 30% or less, the rolling process which is relatively expensive can be reduced as well as a thin heat sink substrate of about 1–2 mm can be obtained.

A reason why it is made preferable that the degree of rolling is not beyond 40% is that when it is beyond 40%, the ratio of the maximum particle size to the minimum particle size of molybdenum is made to 3 to 4 and characteristics of the material of the present invention and the economical superiority thereof are lost by it. In this case, it is not necessary to execute hot rolling in a large degree but it is rather preferable to carry out cold rolling or a warm rolling at 400° C. or less. This is because that the execution of the cold or hot rolling can achieve a mass production process without almost taking protection against heat, health and safety which will be required in hot rolling into consideration.

When a press work is executed after rolling in the present invention, it is found that the present invention is excellent in that the pressure of the press work is reduced in a shape having a step (a cavity type) to which the press work is executed in a relatively small degree and further the present invention is also excellent in the stabilization of the occurrence of hair cracking, although it is a slight degree.

Plating is indispensable to the heat sink substrate of the present invention. Since the chemical property of copper is greatly different from that of molybdenum, stable plating conditions by which any fine void and uneven copper impregnation can be prevented reside in a very narrow region, if the heat sink substrate is subjected only to honing after the completion of the impregnation. However, it is found in the present invention that the application of rolling can greatly improve the stability of the plating even if it is executed in a slight degree.

From the above mentioned, the present invention can also provide an ordinary small size convenient heat sink substrate.

The thickness of a small size heat sink substrate used to a microwave package and so on is naturally thin in many cases as well as the heat sink substrate is often required to be pressed to a deformed shape different from a simple flat shape. In this case, it is needless to say that any problem arises to the characteristics of the heat sink substrate of the present invention even if it is further rolled to reduce the thickness thereof. However, since the present invention place emphasis on mass production, that is, on cost effectiveness, it is needless to say that an increase in the rolling work will lower the cost effectiveness.

Although a method of manufacturing PCMs 40- 26 with a CIP pressure set to 1–2.3 ton/cm² is disclosed in the above description, PCMs up to 30 are actually manufactured at CIP pressure set to 2 ton/cm² from the inconvenience in practical application.

Figure 2:
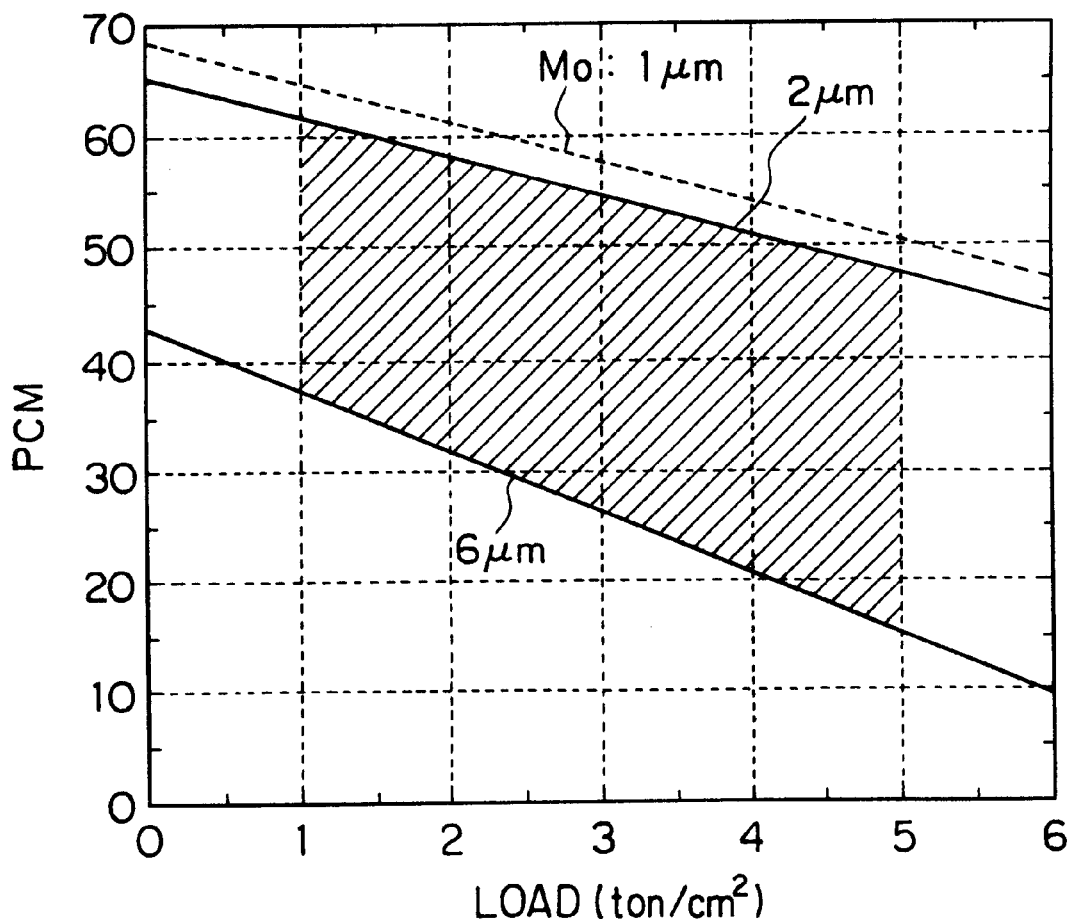
FIG. 2 is a graph showing the relationship between a Mo grain size and a compacting pressure.

However, as a result of a diligent study of the relationship between a Mo particle size and a compacting pressure in a hydraulic press, the region where impregnation of copper is possible, that is, the region where so-called PCMs can be manufactured is found as shown in FIG. 2. Further, since a material having thermal conductivity of 170 W/m·K or more can be practically used and a material having a thermal expansion coefficient up to about $12 \times 10^{-6}$/K can be applied to a microwave semiconductor, there can be obtained a merit that the field to which the heat sink substrate is applicable can be greatly widened by increasing the range to which the present invention is applied from the copper content of 30–40 wt % (PCMs 30–40) to the copper content of 20–60 wt % (PCMs 20–60). That is, according to FIG. 2, so-called PCMs 20–60 can be manufactured by adjusting the particle size of molybdenum from 2 to 6 μm and adjusting the compacting pressure of the press from 1 to 5 ton/cm².

When the particle size of molybdenum is 1 μm, a prescribed amount of copper cannot be impregnated because a compacting property is not good, the intervals between the molybdenum in a green compact are narrow, great contraction arises when the material is impregnated with copper and the impregnating property of copper is bad. Whereas, when the particle size of copper exceeds 6 μm, a reducing temperature must be increased. As a result, there is caused a problem that a fireproof material is greatly consumed, a reducing (charge) amount must be increased and a material which is not reduced is liable to be produced. Further, it is difficult to manufacture a molybdenum powder having the above particle size as well as the compacting property is very bad. Therefore, the molybdenum powder having the size exceeding 6 μm is not practically applicable. When compacting pressure is less than 1 ton/cm², the handling of the compacted material is made bad, whereas compacting pressure exceeding 5 ton/cm² cannot be ordinarily employed because a press must be specially build from the view point of durability and further special steel must be used as the material of a metal mold to endure the pressure. As to the relationship of the hydraulic press to the CIP, since the CIP has a better compacting property than the hydraulic press, the compacting pressure of the CIP can be set to a value 10 to 20% lower than that of the hydraulic press. Although 3 ton/cm² is limit compacting pressure which is generally applicable to the CIP, it is found that proper compacting pressure can be set depending upon an application (in particular, depending upon a size).

A point to be noted when the impregnation is executed that the molybdenum powder is liable to be oxidized and when it is oxidized, the wettability of it with copper is lowered (a capillary phenomenon is lowered) and desired copper impregnation cannot be obtained. To cope with this problem, the green compact is reduced in a strong reducing atmosphere of hydrogen at 500–1000° C. Since a continuous furnace is used in the present invention, a reducing process and an impregnating process can be simultaneously executed therein. Accordingly, there is not particularly a problem that a manufacturing cost increases.

When PCMs 50–60 which contain a large amount of copper is manufactured, they can be manufactured using a fine molybdenum powder having a particle size of about 2 μm at low compacting pressure of 1–1.5 ton/cm². However, the use of the fine Mo powder requires a certain degree of skill to control the impregnated amount of copper because the manufacturing process is affected by contraction and the like due to the fine particle size. However, the PCMs in the region where copper is contained in a large amount can be easily made in such a manner that a green compact is prepared from a powder which is made by previously mixing a copper powder of 1–5 wt % with a molybdenum powder and copper is impregnated with molybdenum. A compacted shape can be easily maintained due to the slight amount of the previously mixed copper powder which acts as a binder to the molybdenum powder. Further, since a region for the copper is secured and the impregnation of the copper is promoted, the average particle size of the molybdenum powder can be set to 3–4 μm (generally applicable particle size) and compacting pressure can be set to 1.5–2 ton/cm² (generally applicable pressure). Further, there is a merit that a material cost can be greatly lowered by grading the average particle size of the molybdenum powder from 2 μm to 4 μm.

Figure 3:
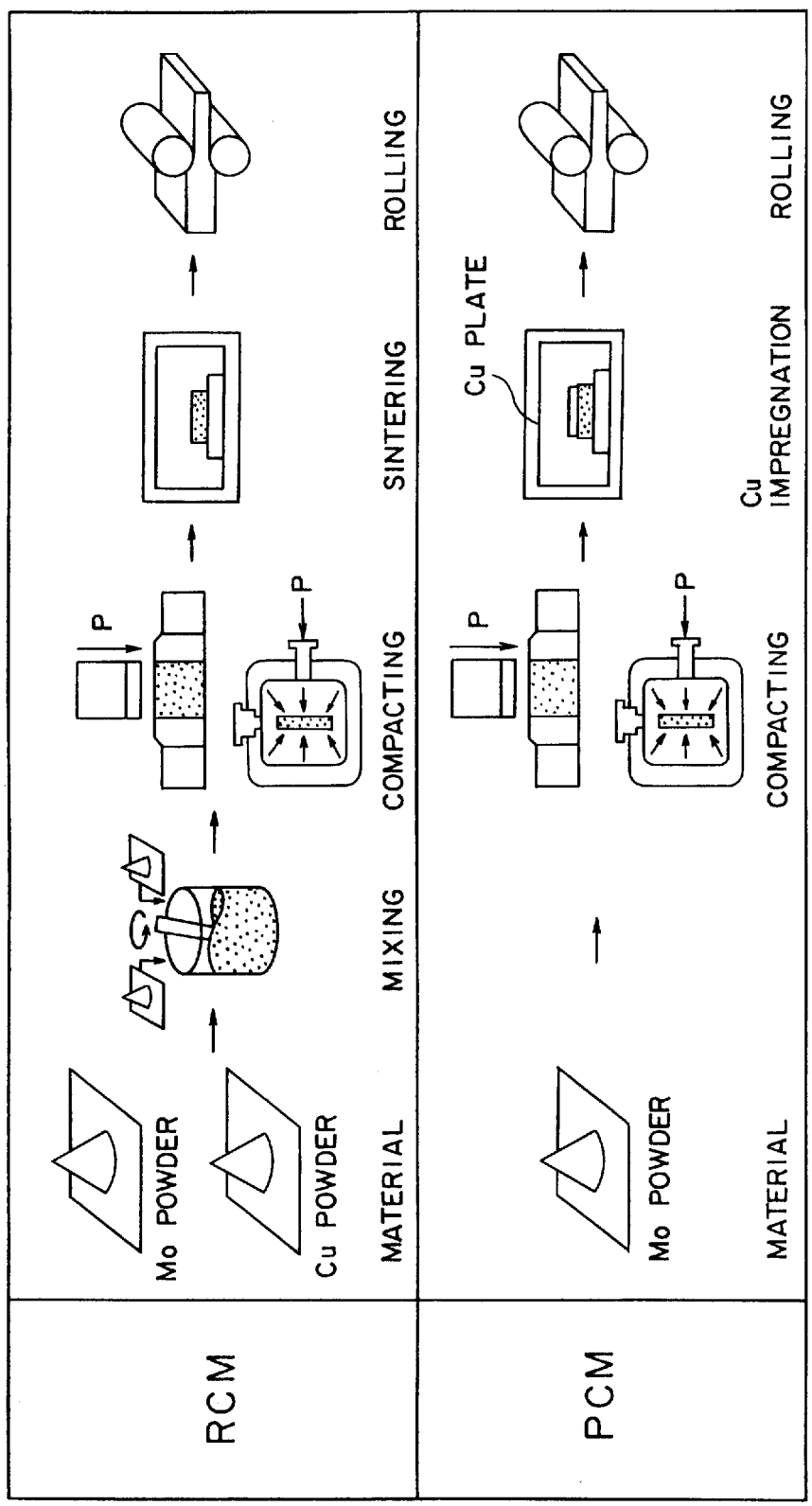
FIG. 3 is a pictorial view schematically showing material manufacturing processes.

FIG. 3 is a pictorial view for comparing the manufacturing processes of TT-RCMs and those of PCMs.

RCMs are manufactured through the processes of blending a copper powder with a molybdenum powder at a prescribed ratio, uniformly mixing a resulting mixture and thereafter compacting the mixture by the hydraulic press or the CIP and sintering and rolling a thus obtained green compact. Whereas, the PCMs of the present invention are manufactured in such processes that a molybdenum powder is compacted by the hydraulic press or the CIP, the resultant green compact is impregnated with copper and then rolled. In the manufacturing processes of PCMS, since one process is omitted from the manufacturing processes of RCMs, a manufacturing cost is lowered as well as a close-grained Cu-Mo composite material can be manufactured.

Figure 4:
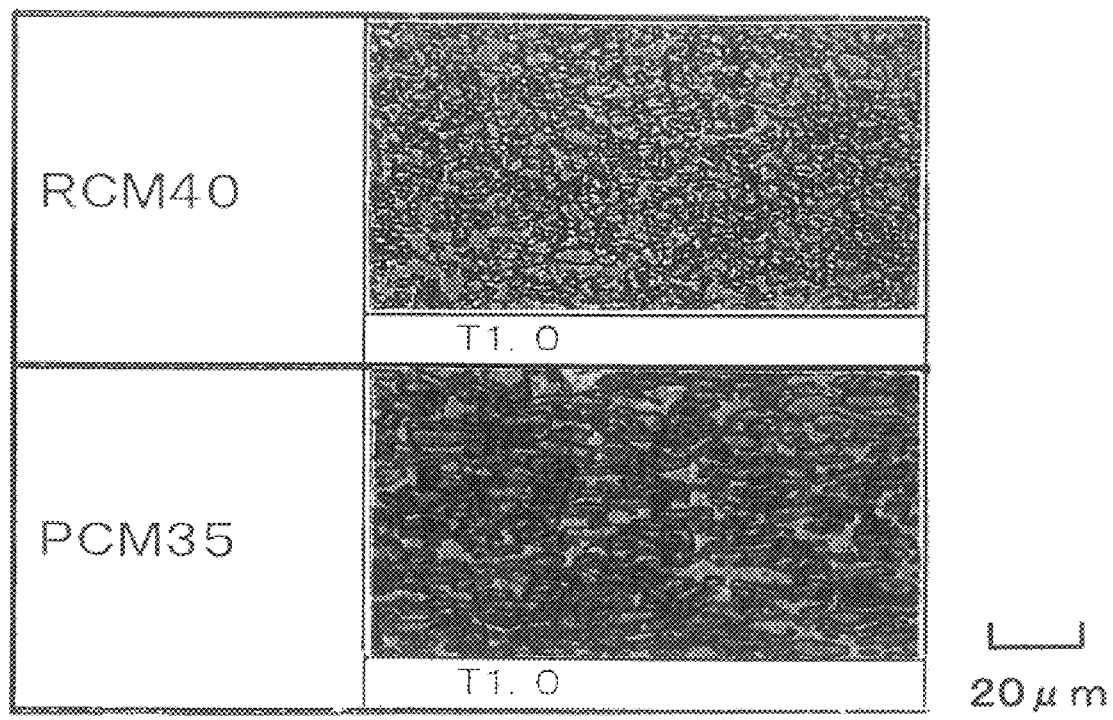
FIG. 4 is a view showing the comparison of the micrometal structures of PCM35 and RCM40 each having a thickness of 1 mm.

FIG. 4 is a view for comparing the metal structure of PCM35 with that of RCM40 each having a thickness of 1 mm. When FIG. 4 is observed from a microscopic point view, the copper in PCM35 occupies a large ratio between molybdenum particles regardless of that the copper is contained at a low ratio. This is a feature of the impregnating method which is a factor for improving workability.

Therefore, the PCMs can be subjected to cold rolling or to warm rolling at a temperature of 400° C. or less. When a material to be impregnated has a thickness of 5 mm or less, it can be worked by cold rolling up to 90%. However, when the thickness of the material is about 10 mm, it must be heated to 150–400° C.

Figure 5:
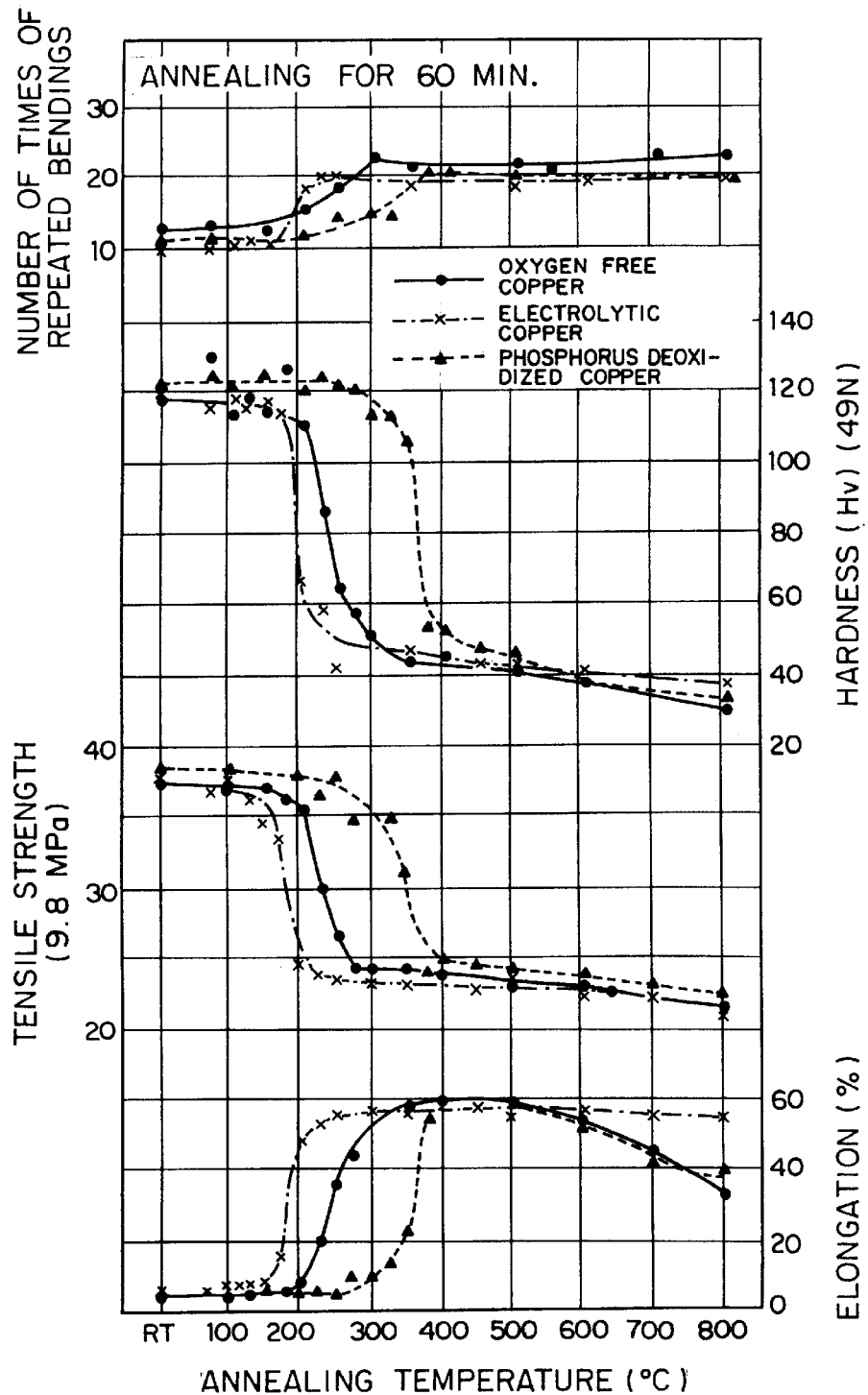
FIG. 5 is a graph showing the effect of an annealing temperature on the mechanical property of various types of pure coppers (1 mm in 50% rolling)

This is because that the tensile strength and hardness of copper begin to decrease at 150° C. and abruptly decrease until it reaches 400° C., whereas the elongation of copper abruptly increases in the same temperature region and this property of copper improves workability. The effect of the property is greatly exhibited in rolling. FIG. 5 shows data extracted from "Metal Data Book" (Furukawa Denko Review) published by Maruzen Publication. It is found from it that any of oxygen free copper, electrolytic copper and phosphorous deoxidized copper which are represented as "pure copper" has an abrupt transition region at 150–400° C. Since oxygen contained copper and electrolytic copper are used as a material with which PCM is impregnated, oxygen free copper, electrolytic copper and phosphorous deoxidized copper can be applied to the manufacturing method of the present invention.

Although it is assumed that RCMs have a similar effect, their effect is very small because the area of copper which occupies one region is smaller than that of PCMs.

The above-mentioned is also applicable to plastic working effected by a press. When, for example, a cavity type heat sink substrate is made by a press, cracking is liable to be caused to RCM40, whereas such cracking is difficult to be caused to PCM35 regardless of that it contains copper in a small amount. Accordingly, workability of PCMs is better than that of RCMs.

Next, examples manufactured according to the present invention will be described below.

EXAMPLE 1

A commercially available copper powder and molybdenum powder were prepared at a weight ratio of 4:6, sufficiently mixed by an alcohol wetting system and perfectly dried. The resultant mixed powder was charged into a polyethylene film bag leaving a sufficient room therein. Green compact thickness setting rods are set in a width direction and thickness setting dams which were formed to the same shape as the above rods and also used as a so-called gate were set in a squeezing direction. The shape of the powder was arranged by being squeezed with a round rod in a thin space surrounded by the above rods and dams.

Next, iron plates were disposed on and under the powder and the bag in which the powder was contained was entirely put into a rubber case while disposing iron plates on and under the powder and a green compact of 11 mm thick was formed by applying pressure of 1.8 ton/cm² thereto.

The green compact was taken out, sintered at 120° C. and thereafter quenched in a zone in a furnace whose temperature was set to 100° C. or less. Subsequently, the green compact was preheated to about 900–1000° C. in hydrogen and hot rolled to a thickness of about 4 mm, then the stain on the surface of the hot rolled plate was removed and subsequently the plate was cold rolled to a product A of the present invention having a finished thickness of 3.1 mm. The product A was annealed at 900° C. for 20 minutes. The size of the resultant product was 3.1 mm thick×150 mm×250 mm with warp of 75 μm.

After the ground metal of the product was caused to appear by surface polishing or blasting, wet plating of a nickel lower ground and then a nickel upper ground were applied to the product A by a conventional method so that the product A was finally finished. The finished product had desired physical properties as shown in Table 2 and there could be obtained an excellent heat sink substrate whose anisotropy was greatly reduced as compared with that of a conventional product.

Although the ratio of copper and molybdenum was set to 4:6 in the example 1, it may be set to 35:65. In this case, a thermal expansion coefficient is made to 8.1×10⁻⁶/K, although thermal conductivity is lowered to 203 W/m·K. Since the heat sink property provided by the product is near to the lower limit of the heat sink property of a power semiconductor device required by the present invention and further the thermal expansion coefficient tends to lower, reliability of the product to exfoliation, cracking and the like is rather increased. It can be said that the amount of copper is at a lower limit amount from the viewpoint of the matching of the heat sink property and expansion.

Figure 6:
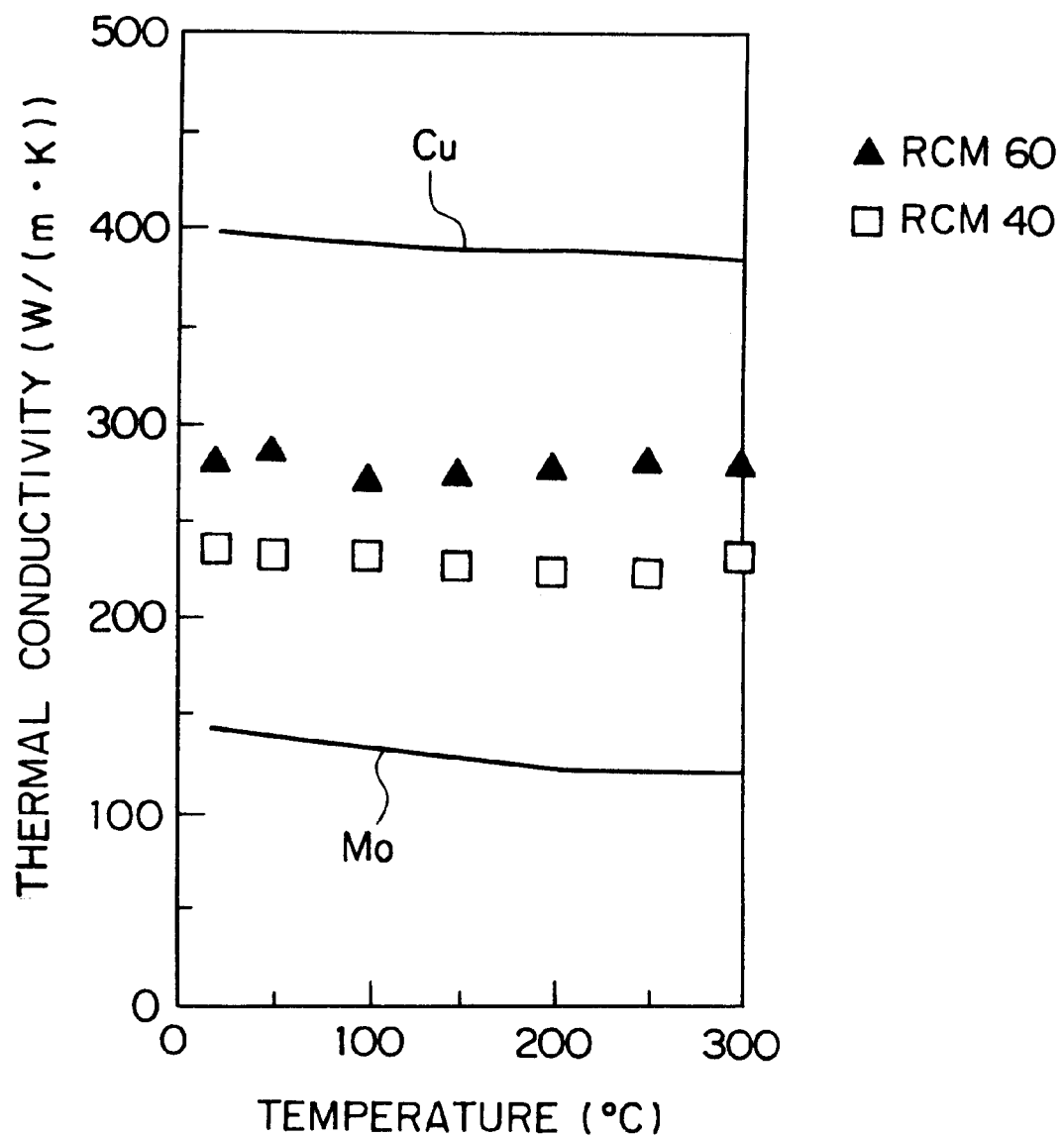
FIG. 6 is a graph showing the relationship between temperature and thermal conductivity in an example of the present invention.

FIG. 6 is a graph showing the relationship between a temperature and thermal conductivity of a large area heat sink substrate according to the example 1. As shown in FIG. 6, the thermal conductivity of the copper-molybdenum single layer composite material does not almost drop at least from a room temperature to 200° C. Accordingly, it can be found that the composite material can sufficiently exhibit its function even if the temperature of a power semiconductor device which requires a large area heat sink substrate increases to 100° C. or higher and sometimes up to about 150° C.

EXAMPLE 2

A perfectly dried powder prepared by the same procedure as the example 1 was compacted to a thickness of 5 mm by a metal mold press and subsequently sintered and quenched under the same conditions as the example 1. Free forging was carried out at 1000 tons, a water type mold releasing agent was sprayed onto a metal mold with a spray gun each time forging was carried out and a green compact was finished as a product B of the present invention which had a size of 2.1 mm thick×70 mm×140 mm at a degree of working of about 55%. After the product B was annealed, its warp was 35 μm. The product B had the following characteristics. That is, the product B had a thermal expansion coefficient of $9.4 \times 10^{-6}$/K with its anisotropy of 0.133 $10^{-6}$/K and thermal conductivity of 200 W/m·K with its anisotropy of 10 W/m·K. When a measuring accuracy is taken into consideration, the above anisotropy is almost negligible. Further, the product B has Young's modulus of 200 GPa. As described above, the thermal conductivity was 200 W/m·K which was just the same as that of the example 1, the thermal expansion coefficient was $9.4 \times 10^{-6}$/K and uneasiness exfoliation and cracking were increased. Actually, however, the product B endured a heat cycle after it was assembled, which was considered to be caused by the great improvement of the anisotropy of thermal expansion coefficient to $0.1 \times 10^{-6}$/K. In fact, the product B had a sufficient level of durability (heat cycles were sufficiently cleared 1000 times).

No void was found in both a rolled material and the forged material and the aforesaid specifications required to a heat sink substrate were cleared. In addition, the warp of the product B was small regardless of that the size (area) thereof was greatly larger than that of a conventional size (area). Thus, it was confirmed that the product B could be used to a power semiconductor device which was provided with a large area heat sink substrate and had high reliability to deformation, exfoliation and cracking.

COMPARATIVE EXAMPLE 1

A material having the same composition as the example 1 was prepared and compacted by a metal mold press at pressure of 2.5 ton/cm². The resultant green compact was subjected to sintering, rolling and annealing likewise the example 1 of the present invention to thereby obtain a plate of 3.0 mm thick×150 mm×250 mm and the physical properties thereof were measured. As a result, the plate had thermal expansion coefficient of $8.7 \times 10^{-6}$/K with its anisotropy of $1.6 \times 10^{-5}$/K and thermal conductivity of 234 W/m·K with its anisotropy of 30 W/m·K. When a power substrate having the same arrangement as the example 1 of the present invention was assembled using the comparative example 1, the life of the comparative example 1 was abruptly deteriorated when a heat cycle was repeated 170 times, in contrast to the example 1 of the present invention which sufficiently maintained its performance even if a heat cycle was repeated more than 500 times. Since a heat cycle of at least 300 times was required, the comparative example 1 could not satisfy the requirement.

COMPARATIVE EXAMPLE 2

Copper was mixed with molybdenum at a composition ratio of Cu:Mo=63:37 and a plate having a thickness of 4.4 mm was prepared as a comparative example 2 by the same method as the example 1. The elongation of the plate was larger than the example 1 of the present invention in the direction of a lengthwise length of 250 mm and its value was expected to be about 320 μm, regardless of that the thermal expansion anisotropy of the plate was suppressed to $0.4 \times 10^{-6}$/K. When a power semiconductor device was actually assembled using a heat sink substrate composed of the plate, the temperature of the heat sink substrate increased, for example, and the thermal characteristic of the heat sink substrate was bad after it was assembled. When the heat sink substrate was disassembled and examined, a copper-bonded AlN substrate (one of AlN substrates on which a plurality of semiconductor elements were mounted) began to partially exfoliate from the heat sink substrate, regardless of that the thermal conductivity of the material was about 299 W/m·K when a heat cycle was repeated about 200 times. Thus, it was found that the durability, that is, reliability of the comparative example 2 could not be continuously evaluated. That is, the comparative example 2 did not has sufficient reliability as a material for a power semiconductor device.

From the above result, it is expected that the upper limit of the thermal conductivity of the examples 1 and 2 is $12 \times 10^{-6}$/K. Since the thermal conductivity also depends upon the type and number of components mounted on the heat sink substrate, however, it is preferable to set the upper limit of the thermal conductivity to $9 \times 10^{-6}$/K to obtain higher reliability.

As described above, according to the present invention, there can be provided a heat sink substrate which can satisfy required characteristics as well as form a power semiconductor device having a large area and high reliability and a method of manufacturing the same.

Further, according to the present invention, there can be provided a power semiconductor device using the heat sink substrate.

EXAMPLE 3

A green compact of 5(T) thick×80×185 mm was made from a molybdenum powder having an average particle size of 4 μm by means of a hydraulic press by applying a load of 4.5 ton/cm² thereto. The relative density of the green compact was 70%. A copper plate whose amount was 25 wt % of molybdenum was placed on the upper portion of the green compact and the copper plate was melted at 1300° C. and infiltrated into (impregnated with) the green compact in a hydrogen reducing atmosphere furnace.

The impregnated body had a size of 4.6 (T)×77×179 mm, impregnated with a copper of 20.5 wt % when the amount was measured with an ICP (inductively coupled plasma) emission analyzer and the relative density of the impregnated body was 97%. The surface of the impregnated body was flattened by liquid honing and it was repeatedly rolled up to 3 mm with rolling reduction of 10% or less while heating it with a hot plate heated to 400° C. The aspect ratio (longest particle size/shortest particle size) of the molybdenum particle in the plate was about 2.

Further, the plate had thermal expansion coefficient anisotropy of 8%, thermal conductivity of 170 W/m·K and Young's modulus of 240 GPa.

The plate was stamped with a metal mold having a size of 100×150 mm in a good state without cracking and fracture caused to the sides and surface thereof. Further, a 3-micron-thick electrolytic nickel plating was applied to the stamped plate and then the plate was subjected to heat treatment in a hydrogen atmosphere at 850° C. for 20 minutes without the occurrence of any defect such as swelled plating, coloring to wheat color, stain and unevenness. Further, Ag (BAg-8) was soldered to the plate, and when the intimate contact strength of the plate was measured, there could be obtained strength of 5 kg/mm².

EXAMPLE 4

An electrolytic copper powder which had an average particle size of 2 μm and whose amount was 2 wt % of a molybdenum powder was mixed with the molybdenum powder having an average particle size of 3 μm. A green compact of 5.5(T) thick×180×185 mm was made from the mixed powder by applying a load of 2.3 ton/cm² thereto by a CIP according to the method disclosed in M-8581. At the time, the relative density of the green compact was 70%. A copper plate whose amount was 25 wt % of molybdenum was placed on the upper portion of the green compact and copper was impregnated with the green compact in a hydrogen reducing atmosphere furnace at 1300° C. The size of the resultant impregnated body was 5(T) thick×160×179 mm, the amount of the impregnated copper was 20.3 wt % (PCM20) and the relative density of the impregnated body was 97%. The surface of the impregnated body was flattened by liquid honing and it was repeatedly rolled up to 3(T)× 260×179 mm with rolling reduction of 10% or less while heating it with a hot plate set to 400° C. The characteristics of the impregnated body were approximately the same as those of the example 3.

Further, the plate was stamped with a metal mold having a size of 240×150 mm to thereby make a large substrate having an area of 360 cm². The state of the substrate was good without no cracking and fracture caused to the sides and upper surface thereof. A 3-micron-thick electrolytic nickel plating was applied to the stamped plate and then the plate was subjected to heat treatment likewise the example 3. When the intimate contact strength of the plate was measured, it was 4.8 kg/mm² and any defect such as exfoliation, swell and the like was caused to the plate. Thus, it was found that the quality of the stamped plate was good. A highly reliable area heat sink substrate having a large area and desired characteristics could be made as described above.

EXAMPLE 5

A green compact of 11 (T) thick×80×185 mm was made by applying a load of 2 ton/cm² to a molybdenum powder having an average particle size of 2 μm by a hydraulic press. At the time, the relative density of the green compact was 35%. A copper plate whose amount was 63 wt % of molybdenum was placed on the upper portion of the green compact and copper was impregnated with the green compact in a hydrogen reducing atmosphere furnace at 1150° C. At the time, the size of the impregnated body was 10(T) thick×75×174 mm and the content of the impregnated copper was 58.8 wt % (PCM60).

The surface of the impregnated body was subjected to liquid honing treatment and it was repeatedly rolled up to 1 (T) mm thick with rolling reduction of 10% or less while heating it with a hot plate set to 250° C. The average thermal expansion coefficient of the rolled plate was 12×10⁻⁶/K, the thermal conductivity thereof was 280 W/m·K and the Young's modulus thereof was 170 GPa.

When the plate was stamped to a part of 15×24 mm, the quality of the part was good without any cracking and fracture caused to the sides and front surface thereof. The stamped part was nickel-plated and then subjected to heat treatment likewise the example 3. When the intimate contact strength of the part was measured, it was 4.6 kg/mm² and the quality of the part was good without any defect such as exfoliation, swell and the like caused thereto.

EXAMPLE 6

An electrolytic copper powder of 5 wt % which had an average particle size of 8 μm was mixed with a molybdenum powder having an average particle size of 3 μm by a dry system. A green compact of 11 (T) thick×80×185 mm was made by applying a load of 1.8 ton/cm² to the mixed powder by a hydraulic press. At the time, the relative density of the green compact was 50%. A copper plate whose amount was 58 wt % molybdenum was placed on the upper portion of the green compact and copper was impregnated with the green compact in a hydrogen reducing atmosphere furnace at 1150° C. The size of an impregnated body at the time was 10 (T) thick×75×174 mm and the amount of impregnated copper was 59.6 wt % (PCM60). The impregnated body was rolled to a thickness of 1 mm in the same manufacturing process as the example 5 and stamped likewise and nickel-plated in the same manner. When the impregnated body was subjected to similar heat treatment and then the intimate contact strength thereof was measured, it was found that the strength was 4.8 kg/mm² and the quality thereof was good without any defect such as exfoliation, swell and the like caused thereto. Further, the respective characteristics of the impregnated body were same as the example 5 and there could be obtained effectiveness as a heat sink substrate from the impregnated body.

EXAMPLE 7

A green compact of 5 (T) thick×80×185 mm was made by applying a load of 1.5 ton/cm² to a molybdenum powder having an average particle size of 4 μm by a hydraulic press. The relative density of the green compact was 60%. A copper plate whose amount was 38 wt % molybdenum was placed on the upper portion of the green compact and copper was impregnated with the green compact in a hydrogen reducing atmosphere furnace at 1300° C. At the time, the size of the impregnated body was 4.6 (T) thick×77×179 mm, the content of the impregnated copper was 35.5 wt % (PCM35) and the relative density of the impregnated body was 98%. The impregnated body was subjected to the same treatment as that of the example 5 and repeatedly rolled up to 0.8 (T) mm thick with rolling reduction of 10% or less while heating it with a hot plate set to 300° C. The rolled plate had an average thermal expansion coefficient of 8.5× 10⁻⁶/K, thermal conductivity of 200 W/m·K and Young's modulus of 220 GPa and made to a material which was effective as a heat sink substrate.

EXAMPLE 8

Figure 7A:
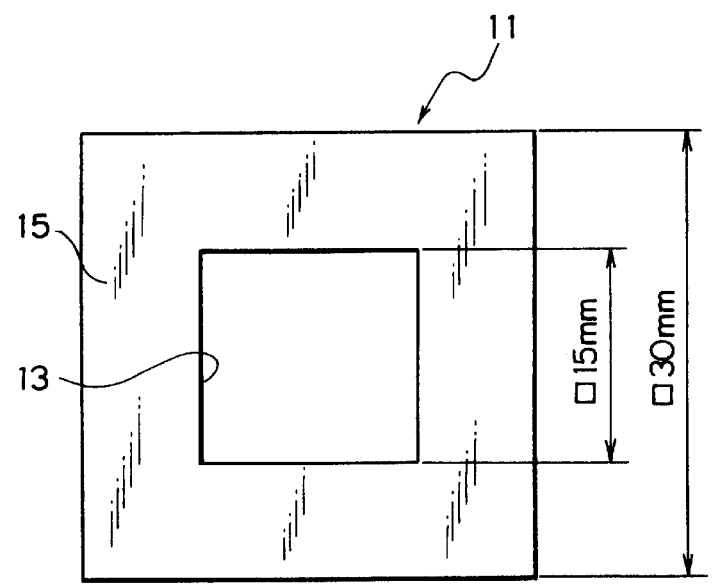
FIG. 7A is a plan view of a deformed heat sink substrate according to an example of the present invention.
Figure 7B:
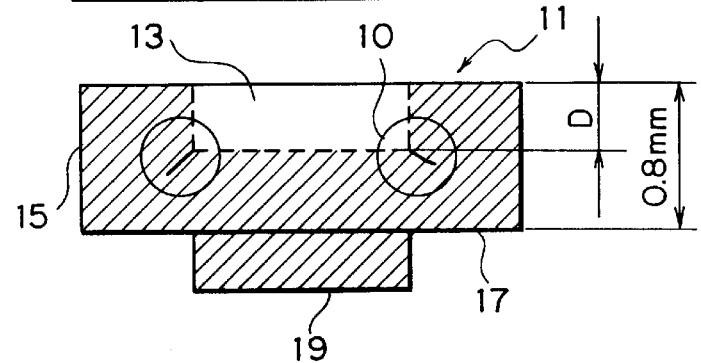
FIG. 7B is a sectional view of the deformed heat sink substrate shown in FIG. 7A.

A cavity type substrate as shown in FIG. 7A and FIG. 7B was pressed from the PCM35 plate which was made in the example 7 and had an outer size of 0.8 (T)×□30 mm at an ordinary temperature. At the time, a recessed portion 13 had an inner size of □15 mm and a pressed depth (D) of 0.35 mm. The clearance between a male die and a female die was set to 25 μm at the time and a metal mold which had a radius R of 0.2 mm formed to the projecting end of the male die was used.

A TT-RCM40 plate having the same thickness was pressed in the same manner for comparison. No defect such as cracking and the like was caused to the stepped portion of the PCM35 plate and further the PCM plate could be pressed to such a shape that even if an element is mounted on the recessed bottom of the plate, sufficient flatness and accuracy of the plate could be obtained. Whereas, a small cracking was found at the portion of the RCM40 indicated by numeral 10 and it was found that the PCM plate had better workability when it was compared with the PCM plate in the regions thereof having a similar composition.

EXAMPLE 9

A large area heat sink substrate was made from the example 9 as described below.

A commercially available sieved molybdenum powder was entirely charged into a rubber case together with iron plates disposed on and under the molybdenum powder and compacted to a green compact of 155×255×3.3 or 5.3 mm at pressure of 1.8 ton/cm² by an isostatic press (CIP).

The molybdenum green compact was placed on a copper plate having a prescribed shape and gradually heated from 1100° C. to 1150–1300° C. in a hydrogen atmospheric heat treatment furnace. The temperature was set higher as the particle size of the powder was finer and lower as it is coarser within a range of, for example, 2–6 μm (the value was measured by FSSS method according to JIS H2116). A finally treating temperature had to be a temperature at which copper could be substantially melted and set to at least 1150° C. It had to be avoided that a structure was deformed. When a compacting pressure was high, a high temperature was preferable because copper was difficult to be impregnated. However, it was found that the temperature had not to be exceed 1300° C., as a result of experiment.

Next, honing was carried out to obtain a slight amount of surplus copper on a surface and to achieve an accuracy of the shape of the surface. Nickel plating of at least 5 μm thick was applied and products of 3 and 5 mm thick were obtained. The warp of any of the products in a lengthwise direction having a finished length of 250 mm was within 65±5 μm. As a result, when the products were assembled to an inverter having a large capacity, sufficient joint stability could be obtained.

Although the thermal expansion anisotropy of the products was ±0.75×10⁻⁶/K which was a little inferior to that of the forged product, a sufficient performance could be obtained therefrom in practical application. The thermal conductivity of the products was 10 W/m·K. Table 3 shows the measured values of the amount of impregnated copper, thermal conductivity and thermal expansion coefficient of the products to the powder compacting pressure. The products could be made to a thickness up to 9 mm. It was found that a device on which the heat sink substrate made of the example 9 was mounted had high reliability to the deformation of the device and cracking and exfoliation of a component.

TABLE 3

| CIP compacting pressure (ton/cm²) | Copper (wt %) | Thermal expansion coefficient (10 × 10⁻⁶/K) | Thermal conductivity (W/mK) | Young's modulus (GPa) | Density (g/cm³) |
| --- | --- | --- | --- | --- | --- |
| 1.0 | 39.0 | 9.0 | 232 | 212 | 9.6 |
| 1.2 | 35.2 | 8.5 | 220 | 219 | 9.6 |
| 1.5 | 32.2 | 8.2 | 211 | 224 | 9.7 |
| 1.8 | 30.0 | 8.1 | 205 | 228 | 9.7 |
| 2.0 | 30.0 | 8.0 | 200 | 232 | 9.7 |
| 2.3 | 26.0 | 7.3 | 190 | 237 | 9.7 |
|  |  | (RT-850° C.) | (RT-200° C.) |  |  |

When the sectional structure of the example 9 was observed, it was found that copper and molybdenum were uniformly distributed as well as no large particle was contained, press working could be smoothly carried out and no chipping was caused in a periphery. Further, it was also fund that the example 9 could be mounted on a large capacity rectifier used to an electric railcar and electric automobile.

However, thermal expansion coefficient of about 9 among the values shown in Table 3 was an allowable marginal region and further a green compact having this thermal expansion coefficient was liable to be cracked while it was handled. Thus, it is not preferable in practical application. When a compacting pressure was 2.3 ton/cm², the thermal conductivity was lower than 200 W/m·K and the aggregation of molybdenum was observed in a structure. This is because that molybdenum was sintered regardless of that copper was impregnated while gradually increasing its temperature. This phenomenon was inconvenient because it was not changed even if the proper range of the power was selected. As a result, it was found that the upper limit of the compacting pressure was 2 ton/cm² in a practical application.

EXAMPLE 10

A large area heat sink substrate according to an example 10 was made as described below.

A green compact obtained from a commercially available sieved molybdenum powder was sandwiched between copper plates, subjected to heat treatment and honed likewise the example 9. Next, the resultant plate material of 5 mm thick was rolled three to six times and made to 3 mm thick under a warm temperature condition of 300° C. The surface of the plate was clean without unevenness and had an accuracy similar to that of the surface finished by a press.

When the plate was further nickel-plated and annealed in hydrogen and then inspected. As a result, it was found that the plate was normally finished without the occurrence of swell, void and uneven color. When the structure of the plate was observed, the ratio of the longest particle size to the shortest particle size of molybdenum was about 2.

EXAMPLE 11

Plate members of 3 mm to 2.1 mm thick were made in the same manner as the example 10. Heat sink substrates having an outer size of □30 mm, a recessed step of 0.25 mm, a recessed inner size of □15 mm with a flat back surface was pressed from the plate members at an ordinary temperature by setting the clearance between a male die and a female die to 25 μm on one side. The plate members could be pressed to a shape having no cracking at the step. Further, the shape was such that even if an element was mounted on the bottom of the step, its flatness had a sufficient accuracy. Plating could be of course applied thereto and an ordinarily plated state could be obtained likewise the example 10.

For comparison, a copper/molybdenum composite material in which 40% copper was contained was made by mixing copper with molybdenum and sintering and rolling the resultant mixed powder. A plate member of 2.1 mm thick could be easily prepared from the composite material.

When the plate member was pressed likewise the example 11, it was detected in an microscopic inspection that hair cracking was caused to the bottom corner of the step in parallel therewith.

When the ratio of the longest particle size to the shortest particle size of molybdenum was measured, it was 2.7. Since the clack was caused at a portion which was worked orthogonal to a rolling direction, it was assumed that the cracking resulted from the shape of molybdenum.

As described above, according to the present invention, there can be provided a large area heat sink substrate which will be mounted on a large capacity rectifier used to an electric railcar and an electric automobile.

According to the present invention, there can be provided a large area heat sink substrate for obtaining a composite material which has a thermal expansion coefficient near to that of a semiconductor and ceramic insulator and further is excellent in thermal conduction and a method of manufacturing the large area heat sink substrate. The manufacturing method does not add an organic binder which is used in an ordinarily used W-Cu composite material and thus does not need heat treatment for removing the binder. A main process of the manufacturing method is to impregnate a molybdenum green compact with copper of 30–40 wt % and only a few number of processes are necessary in addition to the above process. Accordingly, the method can very economically manufacture the heat sink substrate.

Further, according to the present invention, since a green compact, that is, a material obtained by only compacting a so-called powder under prescribed conditions is impregnated with copper, the control of the uneven distribution of copper (oscillation of copper in the vicinity of its melting point), which would be required in sintering, rolling and forging, is not needed. Therefore, a cost can be reduced because the above control is not necessary, the number of processes needed by the manufacturing method is reduced as compared with those needed by a conventional manufacturing method and the processes employed in the manufacturing method of the present invention are not complex.

In addition, there can be provided a large area heat sink substrate which is economically advantageous and whose outside appearance is not seemingly different from a conventional one and a method of manufacturing the same.

What is claimed is:

1. A heat sink substrate, consisting essentially of a Cu-Mo composite substrate which is formed by impregnating melted copper (Cu) into a molybdenum (Mo) green compact and which is given in the form of a rolled plate obtained by rolling the Cu—Mo composite plate in a rolling direction after impregnation, the rolled plate comprising 20–60 wt % of Cu and exhibiting characteristic anisotropy, said characteristic anisotropy of the rolled plate being specified by a difference between the thermal expansion coefficient in a direction parallel to the rolling direction and that perpendicular to the rolling direction;
the difference between the thermal expansion coefficients being not greater than 8%.

2. A heat sink substrate according to claim 1, consisting essentially of a rolled plate obtained by repeating warm rolling or cold rolling, wherein the rolled plate does not contain any fine void and unevenly impregnated cooper.

3. A heat sink substrate according to claim 2, wherein the rolled plate is stamped to a shape having an excellent accuracy without chipping, cracking and fracture on the end surfaces, sides and front surfaces thereof, the plated layer being in intimate contact with the rolled plate without the occurrence of the swelling, exfoliation and unevenness of the plated layer even if the rolled plate is subjected to heat treatment at 700° C. or higher after plating is applied to the surface thereof.

4. A heat sink substrate according to claim 1, consisting essentially of a rolled plate obtained by rolling the Cu—Mo composite plate, wherein the aspect ratio of the molybdenum particle is defined by longest particle size/shortest particle size in the rolled plate and is 2 or less.

5. A heat sink substrate according to claim 4, wherein the rolled plate has a deformed shape with a recessed step, said deformed shape being made by subjecting the rolled plate to a stamping process.

6. A heat sink substrate according to claim 5, wherein said rolled plate has a surface roughness of Ra$\leq$0.1 mm and a warp$\leq$0.3 mm.

7. A semiconductor package, comprising the heat sink substrate according to claim 6.

8. A heat sink substrate according to claim 1, wherein the amount of impregnated cooper is 10–40 wt % of the total weight of said heat sink substrate.

9. A heat sink substrate according to claim 8, wherein the heat sink substrate is used to a power semiconductor which is used to an electric automobile and electric railcar, the heat sink substrate mounting a plurality of semiconductor elements.

10. A heat sink substrate according to claim 9, wherein the amount of impregnated copper is 20–30 wt % of the total amount of said heat sink substrate.

11. A heat sink substrate according to claim 10, wherein the heat sink substrate has such characteristics that a thermal expansion coefficient is 7–8.5×10$^{-6}$/K, a thermal conductivity is 170–90 W/m·K, a Young's modulus is 220–240 GPa and a density is 10 g/cm$^2$ or less and also has high reliability.

12. A heat sink substrate according to claim 9, wherein the amount of impregnated copper is 30–40 wt % of the total weight of said heat sink substrate.

13. A heat sink substrate according to claim 12, wherein said composite substrate is mounted on a large-capacity rectifier of a vehicle or a car.

14. A heat sink substrate according to claim 1, wherein the amount of impregnated copper is 40–60 wt % of the total weight of said heat sink substrate.

15. A heat sink substrate according to claim 14, wherein the heat sink substrate has such characteristics that a thermal expansion coefficient is 8.7–12×10$^{-6}$/K, a thermal conductivity is 230–280 W/m·K, a Young's modulus is 170–200 GPa and a density is 10 g/cm$^2$ or less.

16. A heat sink substrate according to claim 15, wherein the heat sink substrate is mounted on a microwave semiconductor.

17. A Cu—Mo composite heat sink substrate, consisting essentially of a Cu—Mo composite substrate which is formed by impregnating melted copper (Cu) into a molybdenum (Mo) green compact and which is given in the form of a rolled plate obtained by rolling the Cu—Mo composite plate in a rolling direction after impregnation, the rolled plate comprising 40–60 wt % of Cu and exhibiting characteristic anisotropy, said characteristic anisotropy of the rolled plate being specified by a difference between the thermal expansion coefficient in a direction parallel to the rolling direction and that perpendicular to the rolling direction;
the difference between the thermal expansion coefficients being not greater than 8%;
the Cu∫Mo composite substrate being made from the Mo green compact which comprises a mixture of copper powder not greater than 5 wt % and the balance of molybdenum.

18. A heat sink substrate according to claim 17, wherein the heat sink substrate has such characteristics that a thermal expansion coefficient is 8.7–12×10$^{-6}$/K, a thermal conductivity is 230–280 W/m·K, a Young's modulus is 170–200 GPa and a density is 10 g/cm$^2$ or less.

19. A heat sink substrate according to claim 18, wherein the heat sink substrate is used to mount a microwave semiconductor thereon.

20. A heat sink substrate according to claim 19, consisting essentially of a rolled plate that is obtained by subjecting the Cu-Mo composite substrate to cold rolling or warm rolling, wherein the rolled plate does not contain any fine void and unevenly impregnated copper.

21. A heat sink substrate according to claim 20, wherein the rolled plate is stamped to a shape having an excellent accuracy without chipping, cracking and fracture on the end surfaces or sides thereof, the plated layer being in intimate contact the rolled plate without the occurrence of the swelling, exfoliation and unevenness of the plated layer even if the rolled plate is subjected to heat treatment at 700° C. or higher after plating is applied to the surface thereof.

22. A heat sink substrate according to claim 20, wherein the rolled plate has a deformed shape with a recessed step which is made by subjecting the rolled plate to a stamping process.

23. A large area heat sink substrate semiconductor device, the heat sink substrate consisting essentially of a single layer composite material composed of copper and molybdenum and having a thermal conductivity of at least 200 W/m·K and a thermal expansion coefficient of $12\times10^{-6}$/K or less within a temperature range of from room temperature to 200° C.;

the heat sink substrate exhibiting characteristic anisotropy of thermal conductivity and thermal expansion coefficient in a substrate surface direction thereof;

the characteristic anisotropy being specified by a difference of 12% or less between the lengthwise direction and the lateral direction of the thermal conductivity and by another difference of 8% or less between the lengthwise direction and the lateral direction of the thermal expansion coefficient.

24. A heat sink substrate according to claim 23, wherein the heat sink substrate has a thermal conductivity of at least 230 W/m·K within the temperature region from room temperature to 200° C.

25. A heat sink substrate according to claim 24, wherein the heat sink substrate has a thermal expansion coefficient of $9\times10^{-6}$/K or less.

26. A power semiconductor device, comprising the heat sink substrate claimed in claim 23 and a plurality of power semiconductor elements on the heat sink substrate.

27. A large area heat sink substrate as claimed in claim 23, subjected to a process such that the warp of the heat sink substrate is suppressed to 100 μm or less and that residual strain is caused in a relatively less amount so as to mount the power semiconductor device with high reliability.

* * * * *